United States Patent [19]

Negishi

[11] 4,150,347
[45] Apr. 17, 1979

[54] DUAL BAND PUSHBUTTON ELECTRONIC TUNING SYSTEM

[75] Inventor: Tokuji Negishi, Kawaguchi, Japan

[73] Assignee: Clarion Co., Ltd., Tokyo, Japan

[21] Appl. No.: 745,632

[22] Filed: Nov. 29, 1976

Related U.S. Application Data

[63] Continuation-in-part of Ser. No. 627,196.

[30] Foreign Application Priority Data

Oct. 31, 1974 [JP] Japan .................................. 49-125878

[51] Int. Cl.² ................................................. H03J 5/32
[52] U.S. Cl. ........................................ 334/1; 338/129; 334/7; 334/15
[58] Field of Search ...................... 325/459, 464, 465; 334/1, 3, 7, 15; 338/133, 129

[56] References Cited

U.S. PATENT DOCUMENTS

| 3,624,582 | 11/1971 | Iwasaki .................................. 334/7 X |
| 3,767,112 | 10/1973 | Tonari ........................................ 334/1 |
| 3,792,387 | 2/1974 | Arrington et al. ........................ 334/7 |
| 3,846,732 | 11/1974 | Labude et al. ........................ 334/7 X |

Primary Examiner—Paul L. Gensler
Attorney, Agent, or Firm—Wallenstein, Spangenberg, Hattis & Strampel

[57] ABSTRACT

A tuning device comprises a preset mechanism capable of producing a tuning voltage to be applied to an electronic tuning circuit by moving any push button.

12 Claims, 17 Drawing Figures

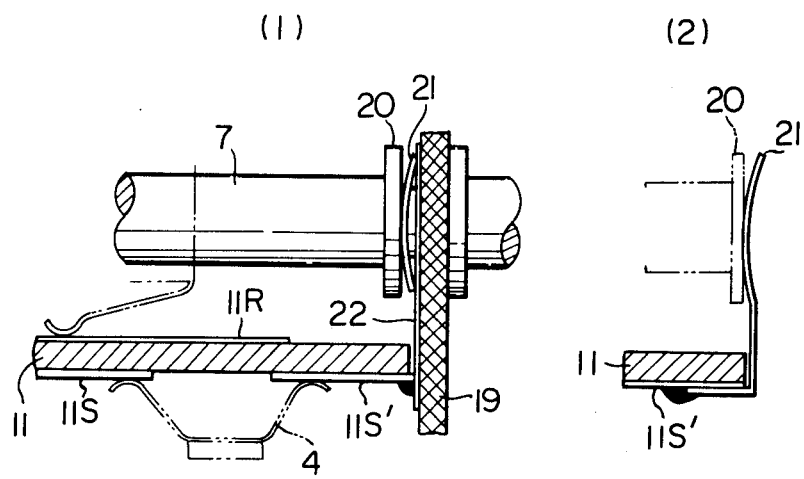
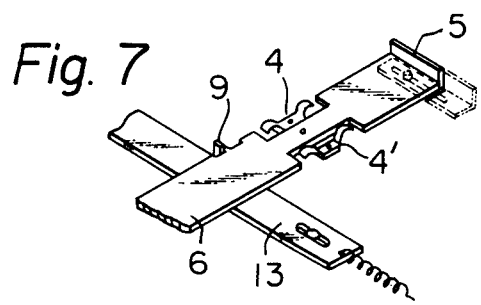
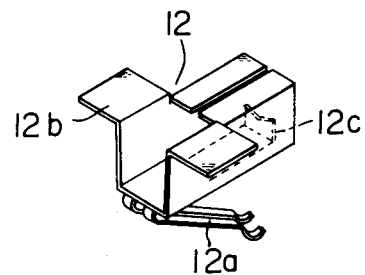
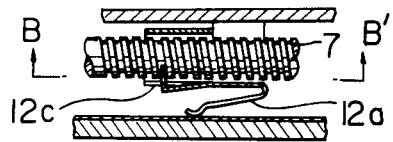

DUAL BAND PUSHBUTTON ELECTRONIC TUNING SYSTEM

RELATED APPLICATION

This application is a continuation in part of application Ser. No. 627,196 of Tokuji Negishi filed on Oct. 30, 1975, now abandoned.

BACKGROUND OF THE INVENTION

This invention relates to a tuning device and more particularly to improvement of a preset and band switching mechanism suitable for an electronic tuning circuit of two kinds of bands, AM and FM.

A preset mechanism for a tuning device used in a conventional radio receiver employs a tuning dial for each preset tuning frequency. Therefore, in the event that the number of preset frequencies is large, there are required many tuning dials. Further, mass production of such devices poses many problems.

SUMMARY OF THE INVENTION

A main object of the invention is to make the design and construction of these tuning devices less complicated.

BRIEF DESCRIPTION OF THE DRAWINGS:

FIG. 6(1) and (2) are enlarged views of a main part in FIG. 4.

FIG. 7 is a perspective view showing an arm and a mechanism associated therewith used in said embodiment.

FIG. 8 is a perspective view showing a sliding member used in said embodiment.

FIG. 9 is a schematic diagram showing a screw on which the sliding member is mounted.

DESCRIPTION OF THE PREFERRED EMBODIMENTS

Figure 1:
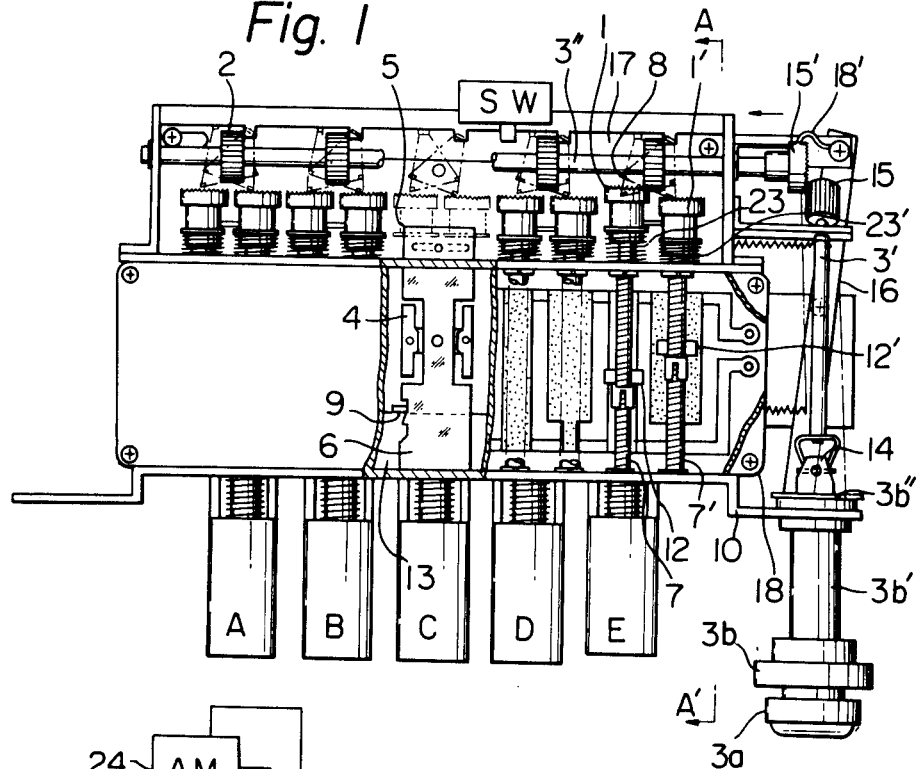
FIG. 1 is a top plan view of an embodiment of the invention.
Figure 3:
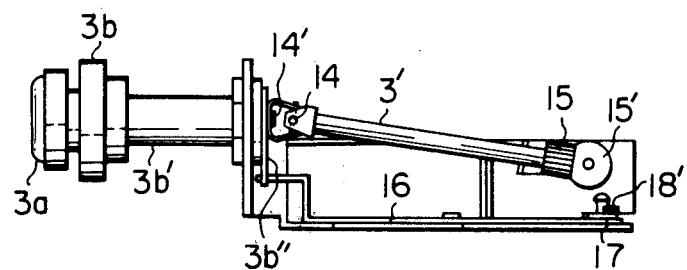
FIG. 3 is a side view of said embodiment.
Figure 4:
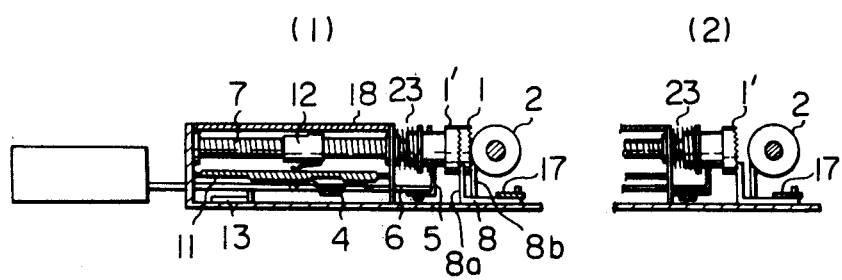
FIG. 4(1) and (2) are sectional views taken in the direction of the arrows along line A—A' in FIG. 1.

In FIGS. 1, 3 and 4, push buttons A to E are shown secured to the corresponding outer end of five arms 6, respectively, and they are provided with clutch plates 5 at their other ends. As shown in FIG. 7, by pushing one of these buttons the associated arm 6 is engaged with a lock-mechanism 9 to drive a lock slide plate 13 and to return other arms to their original positions. At the same time, by slide contacts 4 and 4', for example, as shown in FIG. 6(1) or (2), connection between switch coatings 11S and 11S' formed on the lower side of a supporting plate 11 is provided.

Figure 5:
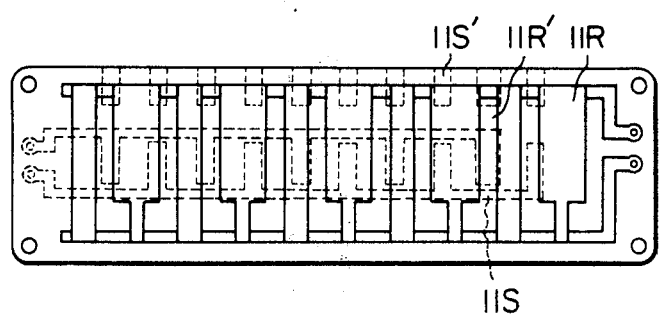
FIG. 5 is a view showing examples of a resistance base and a switch base used in said embodiment.
Figure 10:
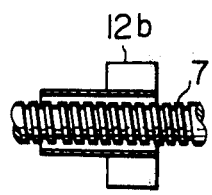
FIG. 10 is a view taken in the direction of the arrows along line B—B' of FIG. 9.
Figure 11:
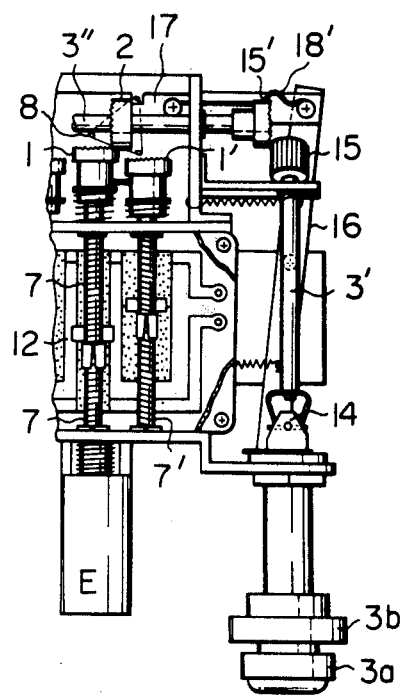
FIGS. 11 and 12 are a top plan view of an other embodiment of the invention.
Figure 12:
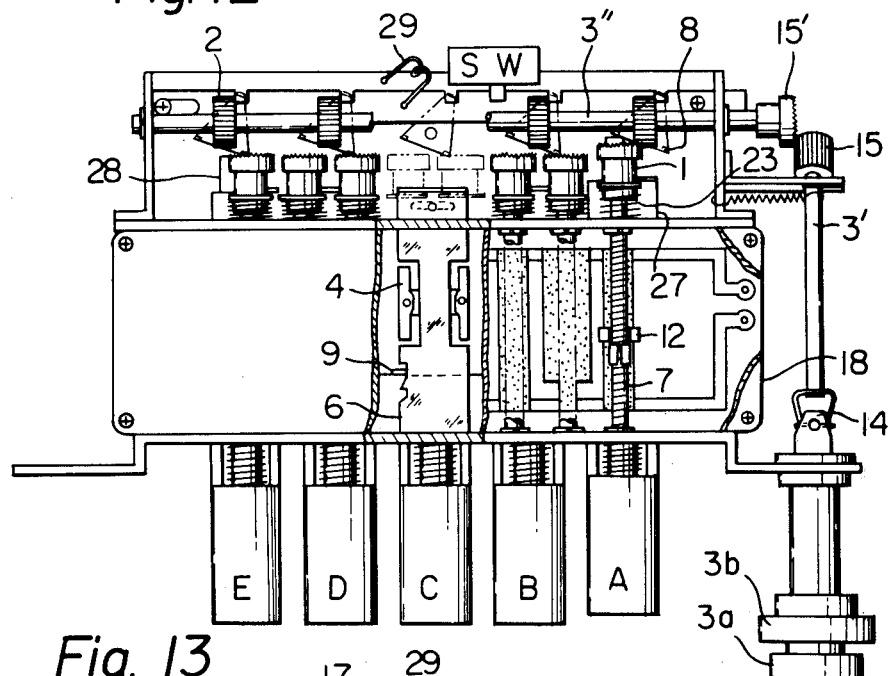

The upper portion of said plate 11 is provided with resistance coatings like 11R and 11R' each having a pattern shown in FIG. 5. Each of said switch coatings 11S and 11S' has a pattern shown in dotted line in the same figure. Sliding members 12 and 12' are disposed on screws 7 and 7', respectively. Crown-like gears 1 and 1' are secured to one of the ends of said screws 7 and 7', respectively and the other ends of the screws are rotatably mounted on a frame 10. Said screws pass through an insulating plate 19 shown in FIG. 6(1) and there is provided spring washers 21 between said plate 19 and E-ring washers 20 mounted on said screws.

A shaft 3" (FIG. 1) is provided with five clutch-gears 2 corresponding to the respective arms 6 and further a coupling lever 17 is provided with five band switching levers 8 corresponding to the respective clutch-gears 2.

When none of the push buttons A to E is pushed, crown-like gears 1 and 1' are kept at a given position where springs 23 and 23' are pressed by the clutch plate 5 constructed at the top end of arm 6, while, when a push button is pushed like button E shown in FIG. 1, crown-like gears 1 and 1' are biased effectively by springs 23 and 23' respectively toward the clutch plate 5. In this state, if a band switching dial 3b is turned in the clockwise direction, a plate 3b" for a driving switching lever 16 is swung by the rotation of a hollow shaft (not shown) which passes through a tube 3b',) the switching lever 16 is positioned as shown with a full line in FIG. 1, and coupling lever 17 is moved outwardly to cause a band changing switch SW (FIG. 2) to be switched. At the same time, as a result of the movement of the coupling lever 17, a band switching lever 8 is rotated in the clockwise direction, so that a first projection 8a of the band switching lever 8 pushes on the crown-like gear 1', while a second projection 8b is released from the crown-like gear 1 as shown in FIG. 4. Accordingly, the crown-like gear 1 biased by a spring 23 is engaged with a clutch gear 2.

In turn, if band switching dial 3b is turned in the counterclockwise direction, the switching lever 16 is positioned as shown with a dotted line through the hollow shaft and the plate 3b" in the same manner, and the coupling lever 17 is moved inwardly (as shown with an arrow in FIG. 1) to cause the band changing switch SW to be switched again. At the same time, as a result of the movement of the coupling lever 17, the band switching lever 8 is rotated in the counterclockwise direction, so that the second projection 8b of the band switching lever 8 pushes on the crown-like gear 1, while the first projection 8a is released from the crown-like gear 1'. Therefore, the crown-like gear 1' biased by the spring 23 is engaged with the clutch gear 2.

In a state where the clutch gear 2 is coupled with the crown-like gear 1 or 1', if a tuning dial 3a is rotated, the screw 7 or 7' rotates through a universal joint 14 comprising an axis 14' passing through the tube 3b', an axis 3', coupling gears 15 and 15', and a shaft 3", thereby causing the sliding member 12 or 12' to slide on the resistance base 11R or 11R' upward or downward. The output of the sliding member is derived outside through a switch base 11S or 11S', a slide contact 4 or 4' and a conductor 22.

Figure 2:
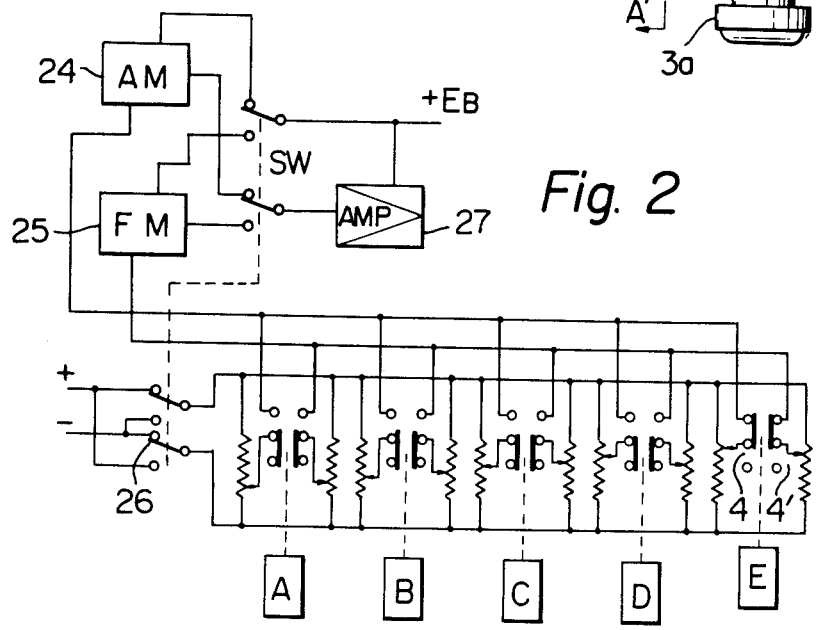
FIG. 2 is a diagram showing the electric circuit of said embodiment.

FIG. 2 shows an electric circuit in the embodiment in FIG. 1. In the same figure, in addition to the components shown in FIG. 1, there are provided a well-known AM electronic tuning circuit 24, a conventional FM electronic tuning circuit 25, a voltage polarity switch 26 and an amplifier 27.

Moreover, FIGS. 8 and 9 show a structure of the sliding member. In the same figures, the sliding member comprises a sliding part 12a adapted to be slidable on the resistance base 11R, a contacting part 12b adapted to be supported on a case 18 and an attaching part 12c adapted to be engaged with the screw 7.

In the apparatus having the above mentioned construction, for example, in order to select a certain AM broadcasting, frequency, a push button like E is pushed on. This causes the slide contacts 4 and 4' to close a circuit as shown in FIG. 6. Then, the tuning dial 3a is rotated to move the sliding member 12 and to apply a voltage derived from the resistance coating 11R to the AM electronic tuning circuit 24 after the switching lever 16 is rotated inwardly to engage the crown-like gear 1 with the crutch gear 2. When desired tuning is established, the operation of said dial 3a is stopped and the tuning condition obtained is kept to complete preset operation whereby thereafter only by pushing on the push button E and rotating the switching lever 16 inwardly, a desired broadcasting can be selected.

In such condition, when it is intended to select a desired FM broadcasting, by rotating the switching lever 16 outwardly, switch SW is caused to switch from the output of said circuit 24 to the FM electronic tuning circuit 25 and thus desired preset operation may be attained in the same manner as mentioned above.

Further, when it is desired to select other FM or AM broadcasting, other push buttons corresponding thereto are pushed on and then the above described preset operation or band switching is carried out to attain the desired tuning.

In addition, in the above mentioned embodiment, if directions of the threads of said screws 7 and 7' are identical to each other the sliding direction of the sliding member 12 becomes reverse to that of the sliding member 12' relative to rotation of the tuning dial 3a, so that two different dial scale devices for indicating selected FM and AM broadcastings must be provided and this causes the arrangement of a tuning apparatus to be expensive and complicated. In order to overcome this problem, firstly, it is considered that the voltage polarity changing switch 26 is adapted to be actuated in cooperation with the switching lever 16 so as to invert the polarity of a voltage applied to resistance bases 11R and 11R'. However, as more simple improvement on said problem, it is preferred that screws 7 and 7' are made reverse to each other in their thread directions. According to this structure, since the sliding direction of said member 12 becomes the same as that of the sliding member 12' relative to rotation of the tuning dial 3a, a single dial scale device for indicating selected broadcastings may be used in a manner similar to the prior art.

Moreover, two clutch gears corresponding to the respective crown-like gears 1 and 1' may be provided.

Besides, in place of the band switching lever 8, a pair of comb-like plates engaging with the respective crown-like gears 1 and 1' may be provided to carry out band switching.

Figure 13:
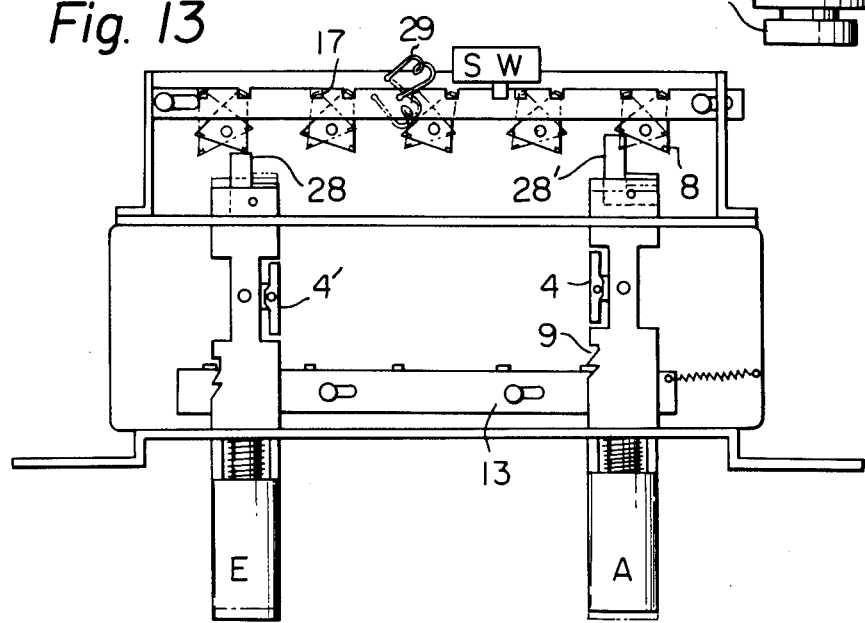
FIG. 13 is a view showing a main part in FIG. 12.
Figure 14:
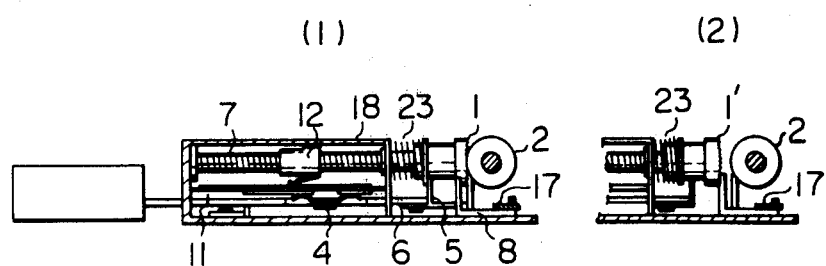
FIG. 14(1) and (2) is a side view of the embodiment shown in FIG. 12.
Figure 15:
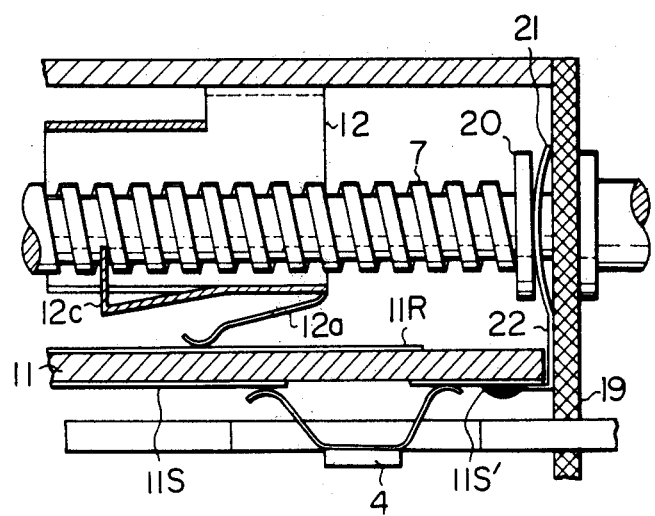
FIG. 15 is an enlarged view of FIG. 14.

FIGS. 12 to 15 show other embodiments of the invention. In these figures, the same reference numerals as those in FIGS. 1 to 11 indicate the same components as those therein. In FIG. 13, the arms at opposite sides of a device are provided with switching plates 28 and 28' at their top ends, respectively.

By pushing either a push button A or E, one of said arms is engaged with a lock-mechanism 9 to drive a lock slide plate 13 and in turn to return other arms to their original positions.

When the push button A or E is pushed, the holding condition of crown-like gears 1 and 1' is released by a clutch plate like plate 5 and a band switching lever 8 is rotated by the top portion of the switching plate 28. At the same time a coupling lever 17 connected to the device with an over-center spring 29 is driven right or left to rotate the band switching levers related to other push buttons B to D.

In selection of any broadcasting, at the same time as pushing the button A or E, the switching plate 28 causes the band switching lever 8 to rotate, thereby engaging the crown-like gear 1 with the clutch gear 2.

As is apparent from the foregoing, for example, the push buttons A and E may be used for selecting AM and FM broadcastings, respectively.

Figure 16:
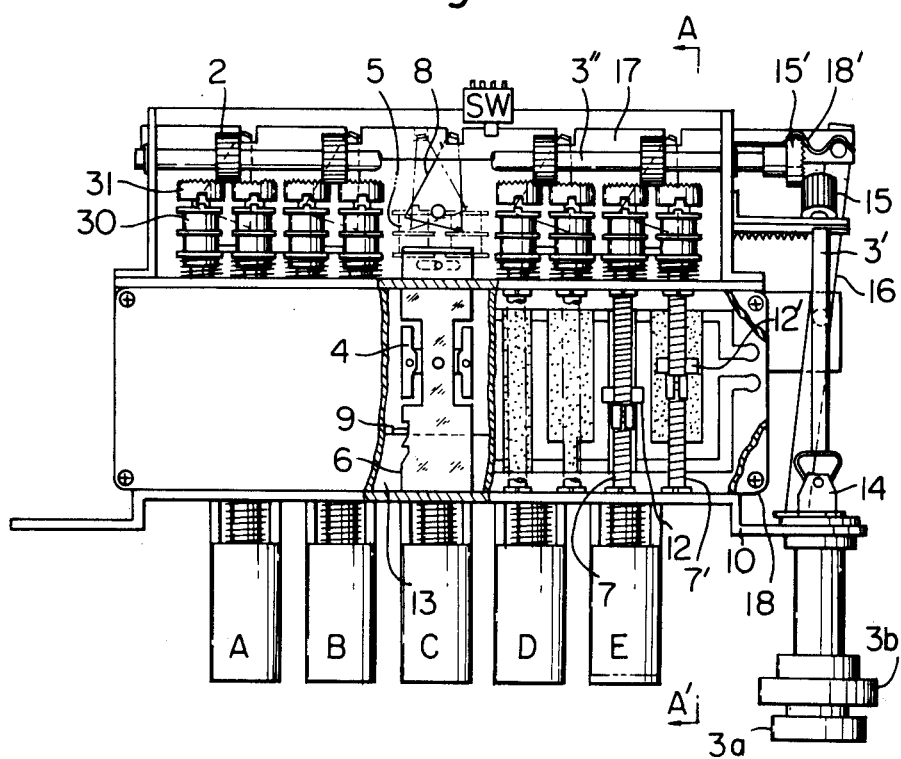
FIG. 16 is a top plan view of still another embodiment of the invention.
Figure 17:
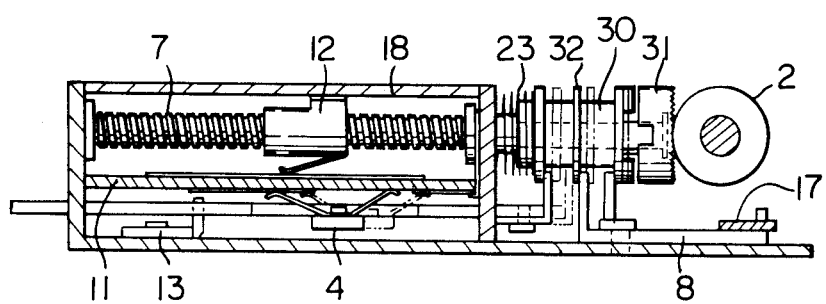
FIG. 17 is a sectional view taken in the direction of the arrows along line A—A' in FIG. 16.

FIGS. 16 and 17 show still another embodiment of the invention. In the same figures, a clutch 30 is provided between a crown-like gear 31 and a screw 7. A recess is formed at the rear part of the gear 31 and a protrusion corresponding to the recess is formed at the top part of the clutch 30. Other construction is the same as that in FIG. 1.

When a push button is pushed, the protrusion of the clutch 30 is coupled with the recess in the gear 31 by a spring 23.

A band switching lever 8 is adapted to couple with a coupling port 32 of the clutch 30.

According to the above-mentioned embodiment, coupling condition in selecting a desired broadcasting may be greatly improved.

What is claimed is:

1. A tuning device for producing a tuning voltage to be applied to an electronic tuning circuit comprising a plurality of arms; a plurality of pairs of contact members, each pair of said contact members being supported by the respective arms and adapted to be actuated by movement of the arm; a plurality of pairs of resistors, each pair of said resistors being provided to correspond to the respective arms; a plurality of pairs of sliding members; a plurality of pairs of supporting members carrying said sliding members, each pair of said supporting members being provided to correspond to the respective arms in such a way that each pair of said sliding members is slidable on the respective resistors; a shaft; a dial for rotating said shaft; a plurality of selecting change members each for selectively coupling the shaft with the supporting member when any arm is pushed; a means for returning other arms to the initial positions when any arm is pushed, and means for providing electrical connection between said sliding members and said tuning circuit.

2. A device according to claim 1 wherein the pair of supporting members comprises a pair of screws each having a crown-like gear at its top end which is adapted to be selectively coupled with the shaft by the associated selecting change member.

3. A device according to claim 2 wherein the pair of screws is constructed that their thread directions are reverse to each other.

4. A device according to claim 2 wherein the sliding member comprises a first part adapted to contact with a case of the device, a second part adapted to slide on the resistor and a third part adapted to engage with the screw.

5. A device according to claim 2 which comprises a base and a plurality of pairs of switch members, each pair of said switch members being provided to be actuated by the respective arms, the base having the resistor formed on one surface thereof and switch contacts formed on another surface thereof, the switch contacts being adapted to be opened or closed by the switch member.

6. A device according to claim 2 which comprises a plurality of pairs of clutch means each being provided between each crown-like gear and each arm, the clutch having a protrusion adapted to couple with a recess formed in the crown-like gear.

7. In a tuning system including first tuning means for tuning a frequency in a first band of frequencies whose value depends on a voltage to be fed thereto and second tuning means for tuning a frequency in a second band of frequencies whose value depends on a voltage to be fed thereto, manually operable band selection means operable to a first condition when a frequency in said first band of frequencies is desired and operable to a second condition when a frequency in said second band of frequencies is desired, and a plurality of manually operable frequency selection controls each operable between an inoperative position and an operative position for selecting a frequency to be tuned in said first band of frequencies when said band selection means is in said first condition and for selecting a frequency to be tuned in said second band of frequencies when said band selection means is in said second condition, the improvement comprising: a different pair of adjustable voltage generating circuits associated with each frequency selection control which pair of circuits respectively produce voltages to effect the tuning of different frequencies in said first and second bands of frequencies when the associated frequency selection controls are operated; a common manually operable voltage adjusting control for adjusting the voltage of any selected one of said voltage generating circuits; and control means responsive to the condition of said band selective means and the operation of a given frequency selection control to said operative position for adjusting the voltage only of the voltage generating circuit which is to tune the selected frequency in the selected frequency band.

8. The tuning system of claim 7 wherein said first band of frequencies is an AM frequency band and said second band of frequencies is an FM frequency band.

9. The tuning system of claim 7 wherein said frequency selection control are push button controls.

10. The tuning system of claim 7 wherein each of said voltage generating circuits includes an adjustable potentiometer having a movable wiper; and said control means includes a separate supporting means for moving each of said wipers, a common control shaft rotatable in one direction or the other by the progressive movement of said common manually operable voltage adjusting control in one direction or the other, motion coupling means on said common control shaft for coupling the rotation thereof to the wiper supporting means associated with the frequency selection control moved to an operative position and the band of frequencies determined by the condition of said band selection means.

11. The tuning system of claim 7 wherein there is associated with each of said manually operable frequency selection controls switch means responsive to the operation of such control into said operative position for coupling the voltage produced by the associated voltage generating circuits to the tuning means which is to tune the frequency in the selected band of frequencies.

12. The tuning system of claim 7 wherein said control means includes control shaft means rotatable in one direction or the other in response to movement of said common manually operable voltage adjusting control in one direction or the other, each of said voltage generating circuits having a movable voltage adjusting control which is operated in response to movement of said control shaft means when coupled thereto, and clutch means responsive to the movement of a frequency selection control to its operative position and to the condition of said band selection means for coupling the movement of said control shaft means to the movable voltage adjusting means of the selected voltage generating circuit.

* * * * *